(12) United States Patent
Sugawara et al.

(10) Patent No.: US 6,653,552 B2
(45) Date of Patent: Nov. 25, 2003

(54) PHOTOELECTRIC CONVERSION DEVICE AND METHOD OF MANUFACTURING THE SAME

(75) Inventors: Shin Sugawara, Yokaichi (JP); Takeshi Kyoda, Yokaichi (JP); Nobuyuki Kitahara, Yokaichi (JP); Hisao Arimune, Yokaichi (JP); Toshifumi Kiyohara, Yokaichi (JP); Ken Watanuki, Yokaichi (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/082,788

(22) Filed: Feb. 22, 2002

(65) Prior Publication Data

US 2002/0162585 A1 Nov. 7, 2002

(30) Foreign Application Priority Data

| Feb. 28, 2001 | (JP) | 2001-053288 |
| Mar. 29, 2001 | (JP) | 2001-097713 |
| Mar. 29, 2001 | (JP) | 2001-097714 |
| Mar. 30, 2001 | (JP) | 2001-100387 |

(51) Int. Cl.$^7$ .................. H01L 31/0352; H01L 31/052
(52) U.S. Cl. .............. 136/250; 136/246; 136/251; 257/436; 257/433; 257/466; 257/432; 438/63; 438/64; 438/65
(58) Field of Search ............... 136/250, 246, 136/251; 257/436, 433, 466, 432; 438/63, 64, 65

(56) References Cited

U.S. PATENT DOCUMENTS

| 2,904,613 | A | * | 9/1959 | Paradise | 136/250 |
| 3,025,335 | A | * | 3/1962 | Ralph | 136/250 |
| 3,247,477 | A | * | 4/1966 | Fridrich | 136/250 |
| 4,514,580 | A | * | 4/1985 | Bartlett | 136/250 |
| 5,419,782 | A | | 5/1995 | Levine et al. | 136/246 |
| 6,417,442 | B1 | * | 7/2002 | Fukui et al. | 136/250 |
| 6,437,234 | B1 | * | 8/2002 | Kyoda et al. | 136/250 |
| 6,441,298 | B1 | * | 8/2002 | Thio | 136/250 |
| 2002/0023674 | A1 | * | 2/2002 | Sugawara et al. | 136/243 |
| 2002/0117667 | A1 | * | 8/2002 | Sugawara et al. | 257/59 |

FOREIGN PATENT DOCUMENTS

| JP | 61-124179 | | 6/1986 |
| JP | 2641800 | | 5/1997 |
| JP | 2000-22184 | A * | 1/2000 |
| JP | 2000-022184 | | 1/2000 |
| JP | 2002-217427 | | 8/2002 |

* cited by examiner

*Primary Examiner*—Alan Diamond
(74) *Attorney, Agent, or Firm*—Hogan & Hartson

(57) ABSTRACT

There is provided a photoelectric conversion device comprising a lower electrode, numerous crystalline semiconductor particles of one conductivity type deposited on the lower electrode, an insulator interposed among the crystalline semiconductor particles, and a semiconductor layer of the opposite conductivity type provided over the crystalline semiconductor particles, in which a pyramidal projection having a cross section in the shape of a trapezoid or triangle and a lateral face that faces one of the crystalline semiconductor particles is provided between the crystalline semiconductor particles. In this device, light incident on areas among the crystalline semiconductor particles is reflected or refracted by the pyramidal projection and directed into the crystalline semiconductor particles. Accordingly, this device can achieve high conversion efficiency.

8 Claims, 9 Drawing Sheets

PHOTOELECTRIC CONVERSION DEVICE AND METHOD OF MANUFACTURING THE SAME

This application is based on applications Nos. 2001-053288, 2001-097713, 2001-097714, and 2001-100387 filed in Japan, the content of which is incorporated hereinto by reference.

BACKGROUND OF THE INVENTION

1. Field of the Invention

The present invention relates to a photoelectric conversion device having a substrate with numerous crystalline semiconductor particles deposited thereon, and a method of manufacturing the device. This photoelectric conversion device is used for solar cells and the like.

2. Description of the Related Art

Photoelectric conversion devices using such a raw material as silicon have lower potential to pollute the environment in their production and operation processes when compared with other power generation means. In addition, they are economical since their main energy source is the sun. A photoelectric conversion device with relatively high efficiency that has been in wide practical use is manufactured using wafers as the starting material, in which relatively cheap metal-grade silicon is subjected to various high-purification processes and finally formed into monocrystal or polycrystalline silicon by the Czochralski method or the like, which is then sliced into individual wafers. This conventional-type photoelectric conversion device can receive light at the whole surface of its conversion element and therefore has high conversion efficiency. However, due to the costly starting material, the wafer itself, the solar cell device is bound to be expensive hindering its diffusion.

With the background as above, another photoelectric conversion device which has a substrate with numerous spherical crystalline semiconductor particles of one conductivity type mounted thereon has been devised as a lower-cost photoelectric conversion device (ball solar) in which the amount of semiconductor material usage has been reduced.

The structure of a photoelectric conversion device in the prior art is shown in FIG. 20. This photoelectric conversion device comprises a substrate 91 serving as lower electrode, numerous crystalline semiconductor particles 95 of one conductivity type deposited thereon, an insulator layer 92 interposed among the crystalline semiconductor particles 95, and a semiconductor region 93 of the opposite conductivity type and a protective layer 94 which are laminated together over the crystalline semiconductor particles 95.

In this structure, the use of the spherical crystalline semiconductor particles 95 allows for small usage of semiconductor and cost reduction. However, light incident on the areas among the crystalline semiconductor particles 95 cannot be converted into electricity, which causes the problem of insufficient conversion efficiency.

Now, this is more specifically discussed, picturing the daily movement of the sun. For example, when silicon spheres are most densely and horizontally disposed, sunlight does not directly strike the areas among the closely laid silicon spheres until the sun rises up to around 30 degrees from the horizontal. Accordingly, the utilization ratio of sunlight is relatively high during this period. However, as the sun rises, the ratio of the sunlight that is incident on the areas among the closely laid silicon spheres increases. Consequently, the closer to the right angle the incident angle of the sunlight is, the lower the ratio of utilized sunlight energy to the whole incident sunlight energy becomes in the above mentioned photoelectric conversion device. In other words, since it fails to sufficiently utilize the sunlight that has reached the areas among the silicon spheres, it cannot exhibit high conversion efficiency.

Also, in the structure of the photoelectric conversion device shown in FIG. 20, the crystalline semiconductor particles 95 have smooth surfaces so that light incident on the surfaces of the particles is partly reflected and lost causing the conversion efficiency to drop.

Meanwhile, a generally used insulator layer 92 is an oxide layer which is formed by thermal oxidation, Vapor-phase Growth or the like. When it is formed by thermal oxidation, the processing temperature needs to be high enough in order to obtain an insulator layer 92 with sufficient insulation and thickness, and the processing time is long accordingly. Therefore, under some conditions for forming the oxide layer, the temperature of the metal surface rises so high that the substrate and silicon spheres melt. Similar problems occur when it is formed by vapor phase techniques.

In the structure of the photoelectric conversion device illustrated in FIG. 20, the substrate 91 that serves as lower electrode and the crystalline semiconductor particles 95 are in contact with each other at acute angles θ (less than 90 deg.). For this reason, when the insulator layer 92 is formed between the substrate 91 serving as lower electrode and the crystalline semiconductor particles 95 using anodic oxidation method, the insulator layer 92 is not evenly distributed and voids are generated. It is therefore difficult to form a reliable insulator layer, which causes current leak to occur and deteriorates the function as a photoelectric conversion device.

It is an object of this invention to provide a photoelectric conversion device with high conversion efficiency capable of sufficiently utilizing energy of the sunlight incident on the device.

Another object of this invention is to provide a photoelectric conversion device having a reliable insulator layer which does not create voids in the joining area between the substrate and crystalline semiconductor particles.

Still another object of this invention is to provide a method of manufacturing a photoelectric conversion device that allows an insulator layer to be formed at relatively low temperatures without using thermal oxidation or Vapor-phase Growth.

BRIEF SUMMARY OF THE INVENTION

A. A photoelectric conversion device according to the present invention comprises: a lower electrode; numerous crystalline semiconductor particles of one conductivity type deposited on the lower electrode; an insulator interposed among the crystalline semiconductor particles; and a semiconductor layer of the opposite conductivity type provided over the crystalline semiconductor particles, wherein a pyramidal projection is provided between the crystalline semiconductor particles and a lateral face of the pyramidal projection faces one of the crystalline semiconductor particles.

In this photoelectric conversion device, since a pyramidal projection with a lateral face that faces a crystalline semiconductor particle is provided between the crystalline semiconductor particles, light incident on the area between the crystalline semiconductor particles is reflected or refracted by the pyramidal projection and enters the crystalline semiconductor particles. Accordingly, this invention can provide a photoelectric conversion device with high photoelectric conversion efficiency.

B. Another photoelectric conversion device according to this invention comprises: a lower electrode; numerous crystalline semiconductor particles of one conductivity type deposited on the lower electrode; an insulator interposed among the crystalline semiconductor particles; and a semiconductor layer of the opposite conductivity type provided over the crystalline semiconductor particles, wherein the light-receiving surface of the insulator includes a recess formed at a position between the crystalline semiconductor particles.

In this photoelectric conversion device, since a recess is formed on the light-receiving surface of the insulator interposed between the crystalline semiconductor particles, light rays that have stricken the surface of the insulator and have been reflected from there are bent toward the crystalline semiconductor particles by the recess and absorbed by the crystalline semiconductor particles. Accordingly, the utilization rate of the sunlight that has arrived among the crystalline semiconductor particles is improved, and in particular, the sunlight is effectively utilized when it is vertically incident. A photoelectric conversion device with high conversion efficiency can be thus realized.

C. Another photoelectric conversion device according to this invention comprises: a lower electrode; numerous crystalline semiconductor particles of one conductivity type deposited on the lower electrode; an insulator interposed among the crystalline semiconductor particles; and a semiconductor layer of the opposite conductivity type provided over the crystalline semiconductor particles, wherein the crystalline semiconductor particles comprise a roughed surface.

The roughed surface of the crystalline semiconductor particle makes it easier for light incident on the crystalline semiconductor particle to enter the PN-junction within the crystalline semiconductor particle. Also, light reflected from the roughed surface is scattered in various directions so that part of the light is directed to adjacent crystalline semiconductor particles. Accordingly, the photoelectric conversion efficiency of the photoelectric conversion device is improved. In addition, the adhesion between the crystalline semiconductor particles and the substrate is enhanced.

D. Another photoelectric conversion device according to this invention comprises: a lower electrode; numerous hemispherical crystalline semiconductor particles of one conductivity type deposited on the lower electrode; an insulator interposed among the hemispherical crystalline semiconductor particles; and a semiconductor layer of the opposite conductivity type provided over the hemispherical crystalline semiconductor particles, wherein the surfaces of the hemispherical crystalline semiconductor particles and the lower electrode make an angle of 90 degrees or more.

A method of manufacturing a photoelectric conversion device according to this invention comprises the steps of: joining numerous hemispherical crystalline semiconductor particles of one conductivity type to a substrate having a conductive region at the surface; forming an insulating region among the hemispherical crystalline semiconductor particles by subjecting the conductive region at the surface of the substrate to anodic oxidation; and forming a semiconductor layer of the opposite conductivity type over the crystalline semiconductor particles and the insulating region.

Since the above mentioned photoelectric conversion device comprises crystalline semiconductor particles whose surfaces make an angle of 90 degrees or more with the substrate (lower electrode), it allows formation of a good insulator layer that holds insulation at the junction area between the substrate and the crystalline semiconductor particles when the surface of the substrate is oxidized by anodic oxidation or the like for forming an insulator. Also, the adhesion between the insulator layer and the substrate is enhanced in this arrangement, making it possible to provide a photoelectric conversion device with high conversion efficiency.

According to the above-mentioned method of manufacturing a photoelectric conversion device, an insulator layer is formed by subjecting the conductive region at the surface of the substrate to anodic oxidation. Therefore, it is possible to form a good insulator layer that holds insulation at the junction area between the substrate and the crystalline semiconductor particles at relatively low temperatures. The adhesion between the insulator layer and the substrate is also enhanced. It is therefore possible to provide a photoelectric conversion device capable of restraining leakage current and achieving high conversion efficiency.

Now, structural details of the present invention are described with reference to the drawings.

DETAILED DESCRIPTION OF THE INVENTION

First Embodiment

Figure 1A:
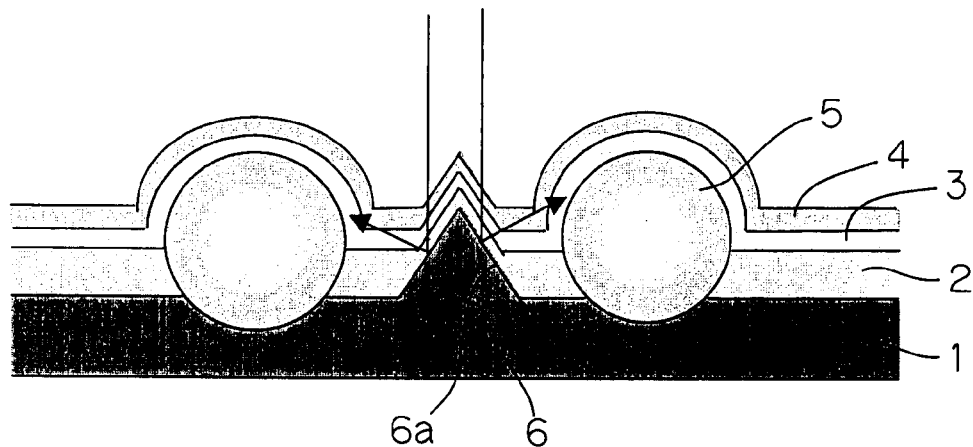
FIG. 1A is a cross-sectional view showing a first embodiment of the photoelectric conversion device according to this invention.
Figure 1B:
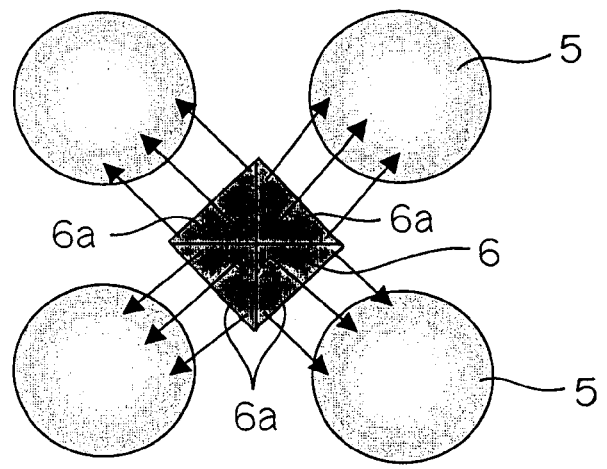
FIG. 1B is a schematic diagram viewed from top showing a reflection pattern with respect to crystalline semiconductor particles arranged in the manner of a tetragonal lattice.
Figure 1C:
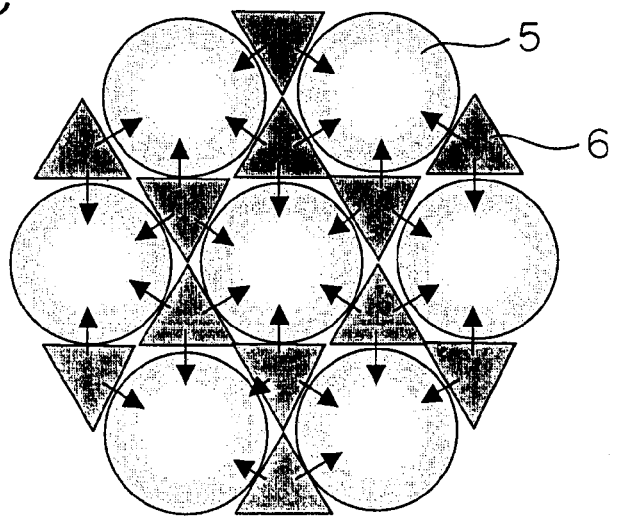
FIG. 1C is a schematic diagram viewed from top showing a reflection pattern with respect to crystalline semiconductor particles arranged in the manner of a hexagonal lattice.

FIG. 1A is a cross sectional view of an embodiment of the photoelectric conversion device according to the present invention, and FIGS. 1B and 1C are plan views showing patterns of reflection of light in the respective photoelectric conversion devices.

As shown in FIG. 1A, the photoelectric conversion device according to this invention comprises a substrate 1 serving as lower electrode with an insulator layer 2 formed thereon, a plurality of crystalline semiconductor particles 5 of one conductivity type disposed on the substrate 1, and an insulator layer 2 interposed among the crystalline semiconductor particles, over which a semiconductor layer 3 of the opposite conductivity type and a protective layer 4 are laminated together. A pyramidal projection 6 is formed between adjacent crystalline semiconductor particles 5, and lateral faces of the pyramidal projection 6 are disposed so as to face the crystalline semiconductor particles 5.

FIG. 1B illustrates crystalline semiconductor particles 5 arranged in the manner of a tetragonal lattice. The pyramidal projection 6 has been formed as a quadrangular pyramid with the base shaped as an approximate quadrangle. The lateral faces 6a of the pyramidal projection 6 are arranged among a plurality of the crystalline semiconductor particles 5 such that each of the lateral faces 6a faces each of the crystalline semiconductor particles 5.

FIG. 1C illustrates crystalline semiconductor particles 5 arranged in the manner of a hexagonal lattice. The pyramidal projection 6 is formed as a triangular pyramid with the base shaped as an approximate triangle. The lateral faces of the pyramidal projection 6 are arranged such that each of the lateral faces is opposed to each of the adjacent crystalline semiconductor particles 5.

Figure 2:
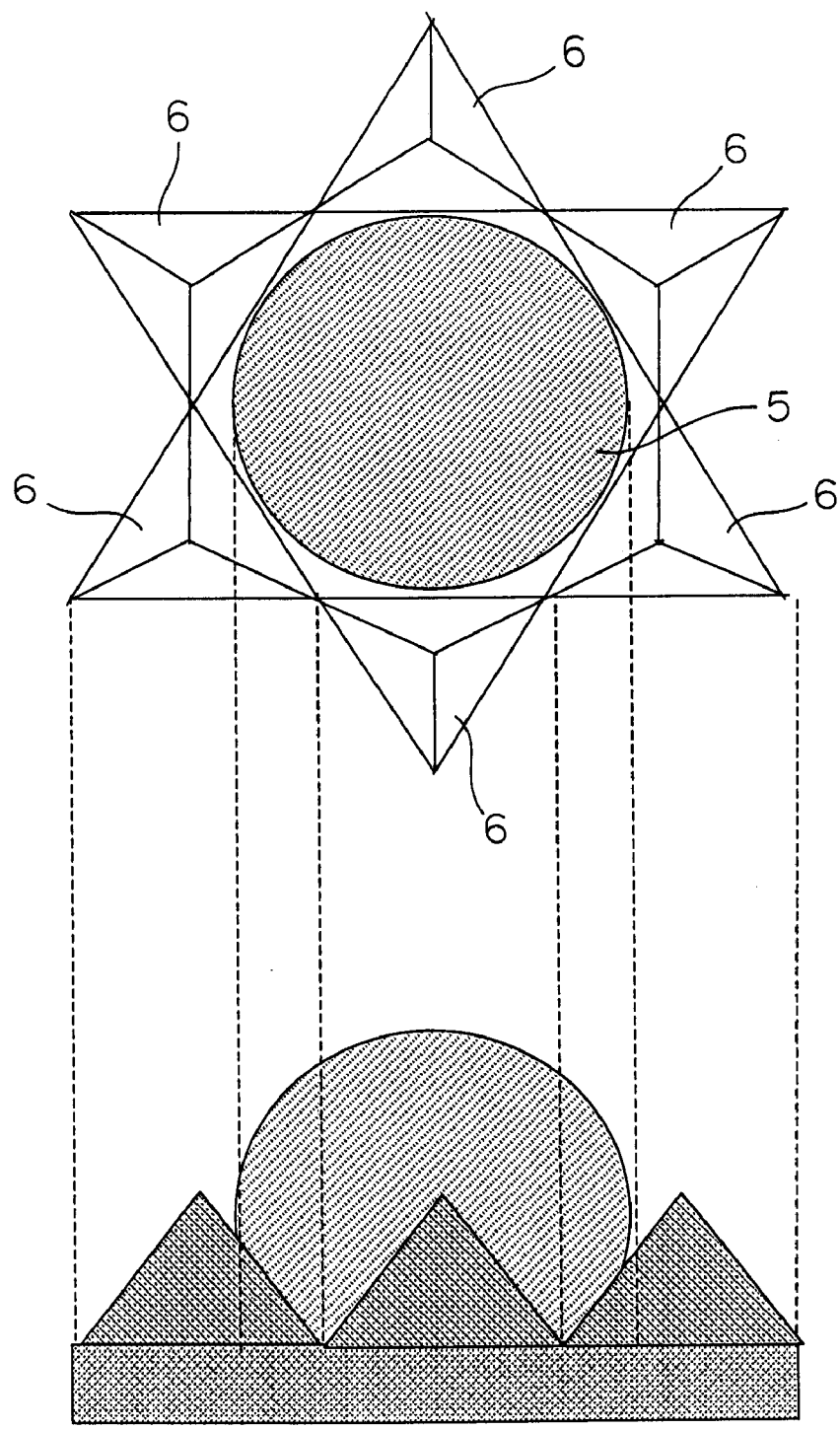
FIG. 2 is a schematic diagram viewed from top showing an arrangement of pyramidal projections surrounding one crystalline semiconductor particle.

An arrangement of crystalline semiconductor particles 5 and pyramidal projections 6 in which the crystalline semiconductor particles 5 are disposed in the manner of a hexagonal lattice is shown in FIG. 2. In FIG. 2, only one crystalline semiconductor particle 5 together with six pyramidal projections disposed around the crystalline semiconductor particle 5 is shown.

It is possible to select the size of the pyramidal projection 6 according to the distance between adjacent crystalline semiconductor particles 5. In order to utilize the light that has entered among the adjacent crystalline semiconductor particles 5 as effectively as possible, the size of the pyramidal projection 6 is preferably the maximum of those able to get into the clearances. In such a case, the pyramidal projections 6 share points of their bases with one another as shown in FIG. 2, and are arranged to surround the crystalline semiconductor particle 5. The lateral face of each pyramidal projection 6 includes a face that is oriented toward the crystalline semiconductor particle 5 so that light incident on the pyramidal projections 6 is efficiently directed to the crystalline semiconductor particle 5.

The structure of the photoelectric conversion device shown in FIG. 1A is now described.

The substrate 1 is formed of metal as a whole. For the metal, Al and its alloys with good conductivity are suitable, although the material is not limited to them. More specifically, the material may be Al with a purity of 99% or more (JIS 1 N99, 1 085, etc.), and Al alloys with small amount of additives such as Al—Si, Al—Mg, Al—Ti and the like.

Also, it is possible to form a substrate by using another metal and an insulator such as ceramics and resin, and to form the above-mentioned metal layer made of Al or the like on its surface.

The crystalline semiconductor particles 5 are composed of Si or Ge, and small amount of p-type impurities such as B, Al, and Ga added thereto. For the crystalline semiconductor particles 5, Si-based materials are suitable in view of resource quantity and mass productivity. The shapes of the p-type crystalline semiconductor particle 2 may be polygons or shapes having curved surfaces. The particle sizes may be even or uneven. However, uneven particle sizes will be advantageous in terms of cost because an additional process is required in order to uniformize the size of the semiconductor particles. Furthermore, use of crystalline semiconductor particles having convex surfaces reduces the dependence of the conversion efficiency on the incident angles of light rays.

Although the arrangement pattern of the crystalline semiconductor particles 5 is not limited to any particular ones, desirably they are arranged in a regular manner in order to face the lateral faces of the pyramidal projection 6. They may also be arranged in the manner of a tetragonal lattice or hexagonal lattice as shown in FIGS. 1B and 1C. When the crystalline semiconductor particles 5 are arranged in the manner of tetragonal lattice as in FIG. 1B, the base of the pyramidal projection 6 is preferably an approximate quadrangle, and when they are arranged in the manner of a hexagonal lattice as in FIG. 1C, the base of the pyramidal projection 6 is preferably an approximate triangle.

A method for arranging the crystalline semiconductor particles 5 is now explained. Holes that are smaller than the particle diameters of the crystalline semiconductor particles 5 are formed in the designed arrangement in a box-shaped jig. The pressure inside the box-shaped jig is decreased by a pump so that the crystalline semiconductor particles 5 are sucked into the holes. Then, the jig is transferred onto the substrate 1, where the pressure inside the jig is increased so that the crystalline semiconductor particles 5 are disposed on the substrate 1. According to this arrangement method, it is possible to easily arrange the crystalline semiconductor particles 5 in a desired manner by designing the arrangement of the holes to be formed in the box-shaped jig. In addition, there is a method in which vibration such as supersonic wave is applied so as to arrange the crystalline semiconductor particles 5.

Since the pyramidal projection 6 is intended to direct the light incident on the areas where the crystalline semiconductor particles 5 are not present to the crystalline semiconductor particles, it may be made of a light-reflective material exerting the effect as a mirror, or a transparent material which exerts the light-refracting effect as a lens.

In the case of the pyramidal projection 6 made of a light-reflective material, light that has entered the pyramidal projection 6 is reflected by the lateral faces of the pyramidal projection 6 and directed to the crystalline semiconductor particles 5, thereby contributing to power generation. As a result, high conversion efficiency can be realized. When the lateral faces of the pyramidal projection 6 are disposed to face the crystalline semiconductor particles, the reflected light does not leave the clearances among the plural number of crystalline semiconductor particles 5, consequently improving the light absorption rate of the crystalline semiconductor particles 5.

In the manufacture of a device using a light-reflective material for forming the pyramidal projection 6, the pyramidal projection 6 may be formed of the same material as that of the substrate 1 serving as lower electrode or a different material.

When the pyramidal projection 6 is formed of a transparent material, light that has entered the pyramidal projection 6 is refracted and directed to the crystalline semiconductor particles 5 so as to contribute to power generation. As a result, high conversion efficiency can be achieved. When the lateral faces of the pyramidal projection 6 are disposed to face the crystalline semiconductor particles, the refracted light does not leave the clearances among the plural number of crystalline semiconductor particles 5, consequently improving the light absorption rate of the crystalline semiconductor particles 5. In the manufacture of a device using a transparent material for forming the pyramidal projection 6, the pyramidal projection 6 may be formed of the same material as that of the insulator layer 2 or a different material.

When forming the pyramidal projection 6 by using a transparent material, the surface of the substrate 1 serving as lower electrode is preferably formed with a low pyramidal projection so that the height of the pyramidal projection 6 can be the largest, by which great quantity of light can be directed to the crystalline semiconductor particles 5.

When forming the pyramidal projection 6 by using a light-reflective material, preferred materials for the pyramidal projection 6 are aluminum, copper, nickel, iron, alloys thereof, and titanium nitride. More desirable materials are aluminum alloys or copper alloys whose main component is aluminum or copper in which silver, gold, platinum, tin, manganese, chromium, titanium, iron, or silicon is contained. This is because they have high reflectance and are inexpensive.

In the formation of the pyramidal projection 6, it is preferable for the vertex of the pyramidal projection 6 to have a height of 5 μm or more and not more than the diameter of the crystalline particles 5. With a height of the vertex larger than the diameter of the crystalline semiconductor particles 5, the pyramidal projection 6 shuts out light that is to directly enter the crystalline semiconductor particles 5 when the light is obliquely incident. This causes the light absorption rate of the crystalline semiconductor particles 5 to drop. When the height of the pyramidal projection 6 is less than 5 μm, the light collecting effect lowers, which is unfavorable. Accordingly, the height of the pyramidal projection 6 is preferably 5 μm or more and not more than the diameter of the crystalline semiconductor particles 5.

As methods for forming the pyramidal projection 6 using a light-reflective material, there are methods including a method in which a substrate 1 serving as lower electrode is formed with pyramidal projections 6 by press molding, and a method in which metal pieces shaped in the form of a polygonal pyramid or cone are attached to a substrate 1 serving as lower electrode by pressure.

As methods for forming the pyramidal projection 6 using a transparent material, there are methods including a method in which an insulator layer 2 formed of a transparent material is applied to a substrate 1 serving as lower electrode, and then pyramidal projections are formed by press molding, and a method in which pieces of pyramidal projections made of a transparent material which are shaped in the form of a polygonal pyramid or cone are attached to the insulator layer 2 by pressure.

The insulator 2 comprises an insulating material for separating the positive electrode from the negative electrode. The insulator layer 2 is intended to prevent leakage current due to short-circuit in the PN-junctions (junctions between 3 and 5) which are the photovoltaic power generation element in the crystalline semiconductor particles 5. The insulator layer 2 comprises a material having light transmittance. In particular, materials that transmit 50% or more of light whose wavelength lies between 400 and 1200 nm that contributes to electric power generation are preferable. The insulator may be formed, for example, by using glass slurry composed of components arbitrarily selected from among $SiO_2$, $Al_2O_3$, PbO, $B_2O_3$, ZnO, or a resin insulator such as polycarbonate.

The opposite conductivity type semiconductor layer 3 is formed by Vapor-phase Growth, thermal diffusion or the like. For example, a vapor-phase phosphorous system compound that is an n-type impurity is added in small amount to a vapor-phase silane compound. The opposite conductivity type semiconductor layer 3 may be monocrystal, polycrystalline, microcrystalline or amorphous. The concentration of the microelement in the n-type semiconductor layer 3 may be, for instance, in the range of $1 \times 10^{16} – 1 \times 10^{22}$ atm/cm$^3$. Meanwhile, it is also possible to form a transparent conductive layer formed of tin oxide, zinc oxide or the like between the semiconductor layer 3 and the protective layer 4.

The protective layer 4 preferably has the characteristics of a transparent dielectric and is formed by the CVD method, the PVD method, sputtering or the like. For example, one or a plurality of materials selected from among silicon oxide, cesium oxide, aluminum oxide, silicon nitride, titanium oxide, $SiO_2$—$TiO_2$, tantalum oxide, and yttrium oxide are used to form a single layer or a combined layer on the opposite conductivity type semiconductor layer 3. It is more desirable to give it the effect of antireflection by controlling the thickness thereof for that purpose.

Moreover, in order to decrease the resistance, it is also possible to provide an auxiliary electrode composed of fingers and bus bars and the like formed in an arbitral pattern by screen-printing or an evaporation technique. It is more desirable to form the auxiliary electrode into a projected shape so that light that has entered the auxiliary electrode is directed to the crystalline semiconductor particles 5.

The present invention is hereinafter described by way of examples and comparative examples.

EXAMPLE 1-1

In this example, pyramidal projections were formed of a light-reflective material. P-type silicon particles with an average particle size of 800 μm were used as crystalline semiconductor particles. The crystalline semiconductor particles were arranged in the form of a hexagonal lattice among which projections in the form of a triangular pyramid were disposed. Each lateral face of the pyramidal projections was oriented toward (in the direction of) each crystalline semiconductor particle. Each edge of the projections was 300 μm long, and the height of the projections was varied as shown in Table 1 as 800 μm, 480 μm, 320 μm, 160 μm, and 5 μm (example 1-1 to 1-5)).

As comparative examples, samples with projections having a height of 960 μm and those with a height of 1.6 μm were evaluated (comparative examples 1-1 and 1-2). Also, a sample with pyramidal projections that were not arranged in the manner that each lateral face thereof is oriented toward (in the direction of) each crystalline semiconductor particle (comparative example 1-3), a sample with conical projections of 320 μm in height whose bases had a diameter of 300 μm (comparative example 1-4), and a sample without projections (comparative example 1-5) were evaluated.

The process of fabricating the photoelectric conversion devices is now described.

A substrate serving also as lower electrode was formed of aluminum. Pyramidal projections were formed on the surface of the substrate by press molding. An insulator layer was formed on the substrate with the pyramidal projections formed thereon.

Glass paste was used for forming the insulator layer to a thickness of 200 μm on the substrate serving as lower electrode. The glass used for the glass paste was a bismuth oxide-based glass having a softening temperature of 510° C. whose average light transmittance for light at wavelengths of 400–1200 nm was 85%. Subsequently, P-type silicon particles with an average diameter of 500 μm were deposited on the insulator layer.

The crystalline semiconductor particles 5 are fabricated by a melt-and-drop method in which dropping is carried out in microgravity where almost no buoyancy or convection is generated and objects have no weight. Accordingly, silicon crystals do not crush due to their own weight and are formed into almost complete spheres.

Subsequently, the insulating layer was fired by heating the substrate with the crystalline silicon particles deposited thereon. By the firing, the insulator layer melts and is deformed so that the crystalline silicon particles and the substrate serving as lower electrode come in contact with each other.

Then, an n-type silicon layer was formed to a thickness of 100 nm over the p-type crystalline silicon particles and the insulator layer, on which a tin oxide layer was further formed to a thickness of 100 nm, where the average light transmittance of n-type silicon layer at wavelengths of 400–1200 nm was 83%. Finally, a 300 nm thick silicon nitride film was formed as a protective layer.

The conversion efficiencies of samples with varied structures and sizes are compared in Table 1-1.

TABLE 1.1

|  | Ratio of the height of pyramidal projection to the silicon particle diameter | Height of pyramidal projection (μm) | Shape of pyramidal projection | Lateral face of pyramidal projection with respect to silicon particle | Conversion efficiency (%) |
| --- | --- | --- | --- | --- | --- |
| Example 1-1 | 1 | 800 | Triangular pyramid | Opposed | 12.9 |
| Example 1-2 | 0.6 | 480 | Triangular pyramid | Opposed | 13.7 |
| Example 1-3 | 0.4 | 320 | Triangular pyramid | Opposed | 13.9 |
| Example 1-4 | 0.2 | 160 | Triangular pyramid | Opposed | 13.7 |
| Example 1-5 | 0.00625 | 5 | Triangular pyramid | Opposed | 11.5 |
| Comparative example 1-1 | 1.2 | 960 | Triangular pyramid | Opposed | 8.8 |
| Comparative example 1-2 | 0.002 | 1.6 | Triangular pyramid | Opposed | 8.7 |
| Comparative example 1-3 | 0.4 | 320 | Triangular pyramid | Not opposed | 8 |
| Comparative example 1-4 | 0.4 | 320 | Cone | — | 8.9 |
| Comparative example 1-5 | — | — | (none) | — | 7.5 |

The "ratio of the height of pyramidal projection to the silicon particle diameter" in Table 1.1 indicates the ratio of the average height of the pyramidal projections to the average diameter of the silicon particles.

Examples 1-1 to 1-5 show the results obtained when triangular pyramid projections were formed and each of their lateral faces was oriented toward each crystalline semiconductor particle, in which their average height was varied. Comparative examples 1-1 and 1-2 show the results obtained when the heights of the pyramidal projections were out of the range of 5 μm to the size of diameter of the crystalline semiconductor particles. A case where triangular pyramid projections were formed with a height of 320 μm in which the pyramidal projections were not arranged in the manner that each lateral face thereof is oriented to face each crystalline semiconductor particle is shown as example 1-3. A case where conical projections were formed is shown as example 1-4 and a case where no projection was formed is shown as example 1-5.

As is obvious from the result in Table 1.1, comparative example 1-4 in which conical projection were formed resulted in a conversion efficiency of 8.9%, while all of examples 1-1 to 1-5 where triangular pyramid projections were formed with heights in the range of 5 μm to the size of diameter of the crystalline semiconductor particles and each of their lateral faces was oriented toward each crystalline semiconductor particle had high enough conversion efficiencies of 11.5–13.9%.

Comparative examples 1-1 and 1-2 with projections in the form of triangular pyramid each of whose lateral face was oriented to face each crystalline semiconductor particle, in which the heights of the projections were out of the range of 5 μm to the size of diameter of the crystalline semiconductor particles had conversion efficiencies of 8.8% and 8.7%, respectively, which were insufficient. Comparative example 1-3 with triangular pyramid projections whose height was 320 μm, where the pyramidal projections were not arranged in the manner that each lateral face thereof is oriented to face each crystalline semiconductor particle resulted in an insufficient conversion efficiency of 8.0%.

EXAMPLE 1.2

An example of the photoelectric conversion device according to the present invention in which pyramidal projections were formed of a transparent material is described below.

Crystalline semiconductor particles were arranged in the form of a hexagonal lattice and projections in the form of a triangular pyramid were disposed among the crystalline semiconductor particles. P-type silicon particles whose average particle diameter was 800 μm were used as the crystalline semiconductor particles. Each lateral face of the pyramidal projections was oriented in the direction of each crystalline semiconductor particle. Each edge of the projections in the shape of a triangular pyramid was 300 μm long, and the average height of the projections was varied as shown in Table 1.2 (Examples 1-6 to 1-10).

Evaluation was carried out also on a comparative example where conical projections with a diameter of 300 μm and a height of 320 μm were formed as the pyramidal projections (comparative example 1-9). A case where no pyramidal projection was formed (comparative example 1-10) and a case where the triangular pyramid projections were not arranged in the manner that each lateral face is oriented toward each crystalline semiconductor particle were also evaluated (comparative example 1-8).

Now, the process of fabricating the photoelectric conversion device is discussed. A substrate that serves as lower electrode was formed of aluminum. An insulator layer was formed by using glass paste to a thickness of 200 μm on the substrate. Then, pieces shaped as pyramidal projections were attached to the glass paste by pressure so as to obtain pyramidal projections comprising a transparent material.

The glass used for the glass paste was a bismuth oxide-based glass having a softening temperature of 510° C. and an average transmittance of 85% for light at wavelengths of 400–1200 nm. Then, p-type silicon particles with an average diameter of 500 μm were deposited on the insulator layer. Heat was applied so as to fire the glass paste.

Subsequently, a 100 nm thick n-type silicon layer was formed over the p-type silicon particles and the insulator layer, and a tin oxide layer was further formed with a thickness of 100 nm. The average light transmittance of the n-type silicon layer at wavelengths of 400–1200 nm was 83%. Finally, a protective layer was formed by using silicon nitride to a thickness of 300 nm.

The results obtained from measurements of conversion efficiencies of the examples and comparative examples are shown in Table 1.2.

TABLE 1.2

| | Ratio of the height of pyramidal projection to the silicon particle diameter | Height of pyramidal projection (μm) | Shape of pyramidal projection | Lateral face of pyramidal projection with respect to silicon particle | Conversion efficiency (%) |
|---|---|---|---|---|---|
| Example 1-6 | 1 | 800 | Triangular pyramid | Opposed | 12.3 |
| Example 1-7 | 0.6 | 480 | Triangular pyramid | Opposed | 13.1 |
| Example 1-8 | 0.4 | 320 | Triangular pyramid | Opposed | 13.2 |
| Example 1-9 | 0.2 | 160 | Triangular pyramid | Opposed | 13.1 |
| Example 1-10 | 0.00625 | 5 | Triangular pyramid | Opposed | 10.9 |
| Comparative example 1-6 | 1.2 | 960 | Triangular pyramid | Opposed | 8.4 |
| Comparative example 1-7 | 0.002 | 1.6 | Triangular pyramid | Opposed | 7.5 |
| Comparative example 1-8 | 0.4 | 320 | Triangular pyramid | Not opposed | 8.3 |
| Comparative example 1-9 | 0.4 | 320 | Cone | — | 8.5 |
| Comparative example 1-10 | — | — | — | — | 7.5 |

The "ratio of the height of pyramidal projection to the silicon particle diameter" in Table 1.2 indicates the ratio of the average height of the pyramidal projections to the average diameter of the silicon particles. A comparative example in which no pyramidal projection was formed and a comparative example with pyramidal projections in the form of a triangular pyramid which were not arranged in the manner that each lateral face thereof is oriented to face each crystalline semiconductor particle are also shown.

Examples 1-6 to 1-10 show the results obtained when triangular pyramid projections were formed and each of their lateral faces was oriented toward each crystalline semiconductor particle, in which their average height was varied. Comparative examples 1-6 and 1-7 show the results obtained when the heights of the pyramidal projections were out of the range of 5 μm to the size of diameter of the crystalline semiconductor particles. A case where triangular pyramid projections were formed with a height of 320 μm and were not arranged in the manner that each lateral face thereof is oriented to face each crystalline semiconductor particle is shown as example 1-8. A case where conical projections were formed is shown as example 1-9 and a case where no projection was formed is shown as example 1-10.

As is apparent from the results in Table 1.2, comparative example 1-9 with conical projections resulted in a conversion efficiency of 8.5%, while examples 1-6 to 1-10 where triangular pyramid projections were formed with heights in the range of 5 μm to the size of diameter of the crystalline semiconductor particles and each of their lateral faces was oriented toward each crystalline semiconductor particle had sufficient conversion efficiencies of 10.9–13.2%.

Comparative examples 1-6 and 1-7 with projections in the form of triangular pyramid whose heights were out of the range of 5 μm to the size of diameter of the crystalline semiconductor particles, where the pyramidal projections were not arranged in the manner that each lateral face thereof is oriented toward each crystalline semiconductor had conversion efficiencies of 8.4% and 7.5%, respectively, which were insufficient. Comparative example 1-8 with triangular pyramid projections whose height was 320 μm, where the pyramidal projections were not arranged in the manner that each lateral face is oriented to face each crystalline semiconductor particle resulted in an insufficient conversion efficiency of 8.3%.

Second Embodiment

Figure 3:
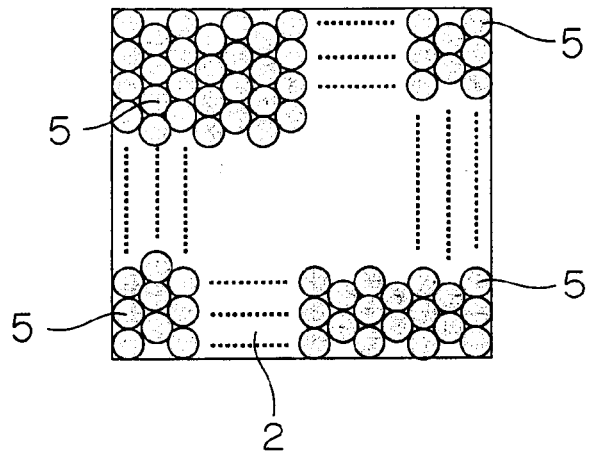
FIG. 3 is a plan view of a second embodiment of the photoelectric conversion device according to this invention in which crystalline semiconductor particles are aligned.
Figure 4:
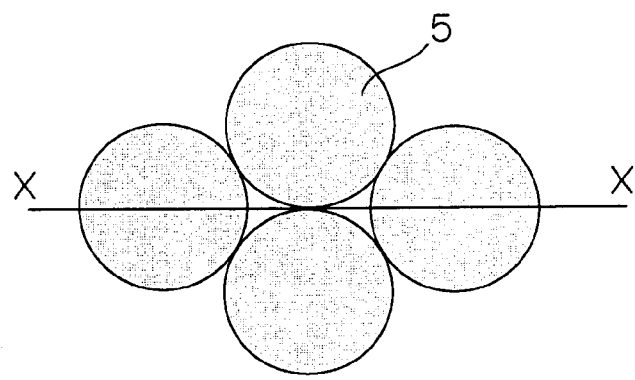
FIG. 4 is an enlarged view of FIG. 3.
Figure 5:
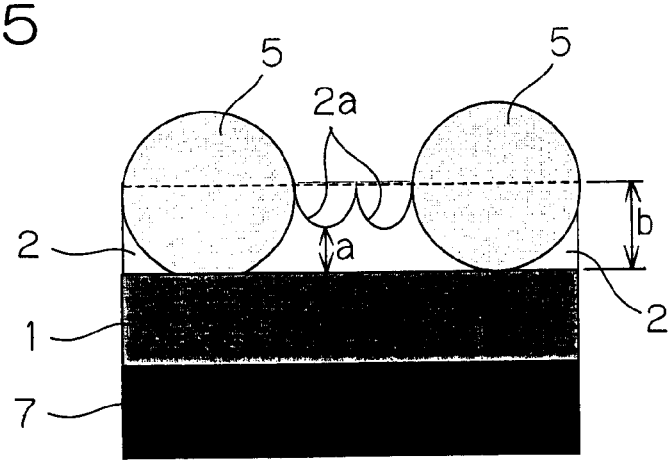
FIG. 5 is a cross sectional view taken from the line X—X of FIG. 14.

FIG. 3 is a plan view showing a second embodiment of the photoelectric conversion device according to this invention, FIG. 4 is an enlarged view thereof, and FIG. 5 is a cross sectional view taken from the line X—X of FIG. 4.

This photoelectric conversion device is arranged as shown in FIG. 5 such that a substrate serving as lower electrode comprising Al and the like is formed on an insulator 7 made of ceramics or resin, on which spherical crystalline semiconductor particles 5 comprising a p-type material such as Si are deposited, and a n-type crystalline semiconductor layer (not shown) is formed over the p-type crystalline semiconductor particles 5.

The p-type crystalline semiconductor particles 5 are composed of Si or Ge, and small amount of P, As and the like added thereto, and the n-type crystalline semiconductor layer is composed of Si or Ge, and small amount of B, Al, Ga and the like added thereto.

Among the crystalline semiconductor particles 5 deposited on the substrate, an insulator layer 2 having recesses 2a is interposed. For this insulator layer 2, insulating materials including glass slurry composed of components arbitrarily selected from among $SiO_2$, $Al_2O_3$, PbO, $B_2O_3$, ZnO, or insulating resins such as polyimide and polycarbonate are suitably used.

Meanwhile, over the crystalline semiconductor particles 5, an antireflection film (not shown) comprising ZnS, $CeO_2$, $SiO_2$ or the like may be formed, or a transparent electrode using ITO or the like may be formed in order to reduce pattern resistance.

The insulator layer 2 may be formed into various shapes. As shown in FIG. 5, when the light-receiving surface of the insulator layer is formed with recesses 2a, the sunlight incident on the insulator layer 2 is bent by the recesses 2a and directed in the direction of the crystalline semiconductor particles 5 so as to be effectively absorbed by the crystalline semiconductor particles 5.

In the above mentioned photoelectric conversion device, the minimum thickness a of the recessed portions in the insulator is preferably not more than 95% of the thickness b of an area other than the recesses. The refractive index of the insulator is preferably neither less than 1.3 nor more than 2 ($1.3 <$ the refractive index $\leq 2$) at wavelength of 300–800 nm.

Figure 6:
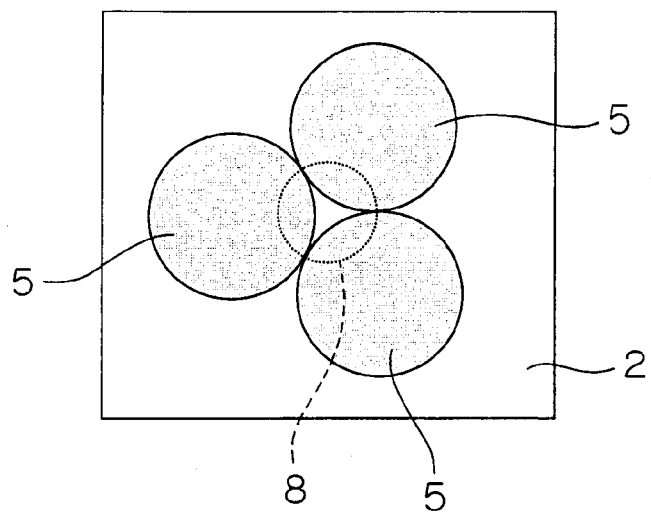
FIG. 6 is a plan view showing an irradiated part 8 in a model having crystalline semiconductor particles most closely arranged therein.

The reason for these ranges is hereinafter described referring to a result of ray tracing analysis. As an optimal arrangement of the crystalline semiconductor particles 5, a simplified model in FIG. 6 where three crystalline semiconductor particles 5 are most closely arranged is assumed.

Figure 7:
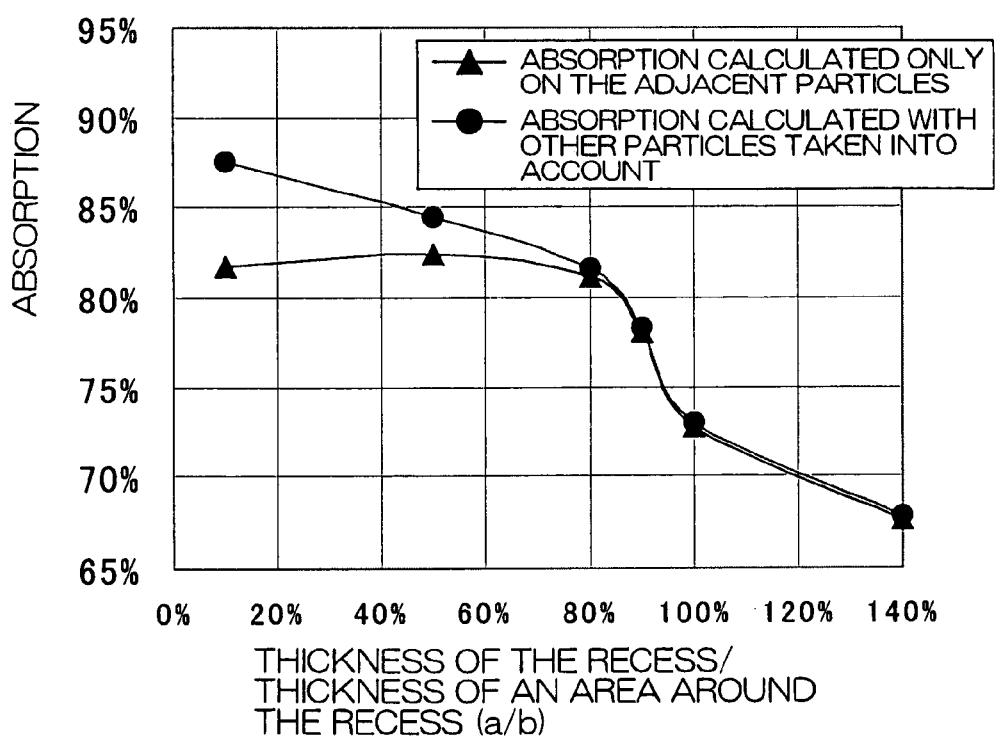
FIG. 7 is a graph showing a result of a ray tracing analysis where the vertical axis represents the ratio of the aggregate amount of absorption by the crystalline semiconductor particles 5 to the quantity of incident light (absorption), and the horizontal axis represents the ratio a/b of the thickness a of a recess or projection of the insulator layer to the thickness b of an area around it.

A ray tracing analysis based on the Monte Calro method was carried out on a sample where light was vertically incident on a circular, irradiated area 8 which was formed by the contact of three crystalline semiconductor particles 5. The ratio of light absorbed by the crystalline semiconductor particles 5 (absorption) was evaluated after varying the surface configuration of the insulator layer 2. FIG. 7 is a graph showing a result of the evaluation.

Figure 10:
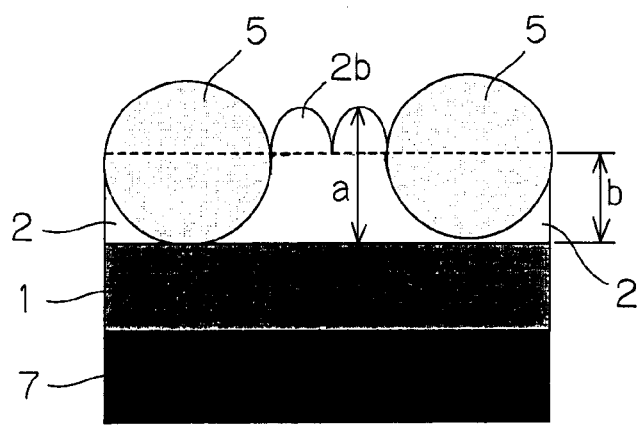
FIG. 10 is a cross sectional view of a photoelectric conversion device having an insulator layer formed with projections.

The surface configuration of the insulator layer 2 was varied by changing the ratio a/b representing the ratio of the thickness a of the insulator layer 2 at a central area between the crystalline semiconductor particles to the thickness b of the same at an area other than the central area. The result of varying the ratio a/b between 10% and 140% shows that when the ratio a/b was 140%, that is, when projections 2b were formed on the surface of the insulator layer 2 as shown in FIG. 10, the ratio of light that was absorbed by the crystalline semiconductor particles 5 decreased from the ratio in the case of the insulator layer that was formed flat.

On the other hand, the ratio of light absorbed by crystalline semiconductor particles 5 increased when the insulator layer 2 was formed with recesses as shown in FIG. 5.

The ratio of light absorbed by the surrounding three crystalline semiconductor particles 5 did not change even when the ratio a/b was lessened. However, the smaller the ratio a/b was, the larger the rate of light absorption became when the absorption by other crystalline semiconductor particles were included (when the ratio of light that was confined inside the insulator layer 2 was taken into account). It has been found that the point of inflection is the point at which the ratio a/b becomes approximately 95%, and the effect is significant when the ratio a/b is not more than 95%. More desirably, the ratio a/b is 80% or less.

Figure 8:
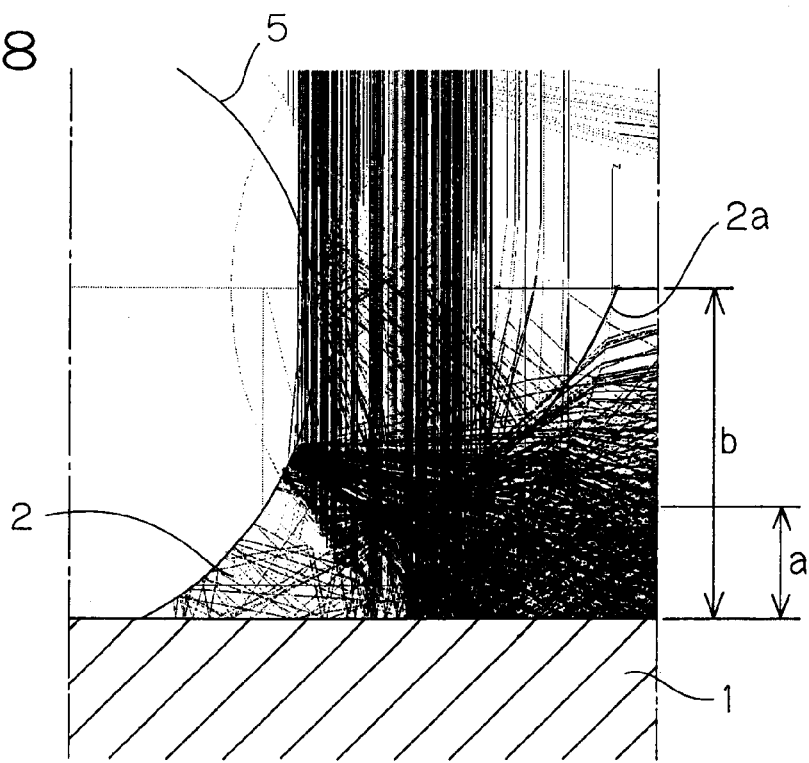
FIG. 8 illustrates a result of ray tracing carried out when a recess whose a/b ratio was 10% was formed in the insulator layer.

FIG. 8 illustrates a result of a ray tracing analysis where the surface of the insulator layer 2 is formed with a recess. The ratio a/b representing the ratio of the thickness a of the central area of the recess to the thickness b of the area around the recess is 10%.

Figure 9:
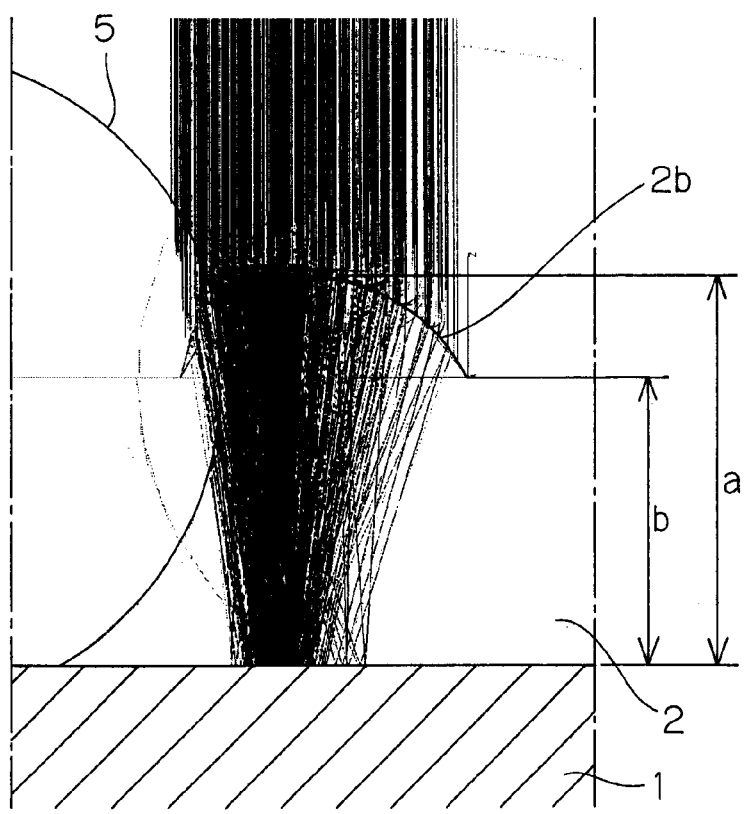
FIG. 9 illustrates a result of ray tracing carried out when a projection whose a/b ratio was 140% was formed in the insulator layer.

FIG. 9 illustrates a result of a ray tracing analysis where the surface of the insulator layer 2 is formed with a projection. The ratio a/b representing the thickness a of the central area of the projection to the thickness b of the area around the projection is 140%.

When the insulator layer 2 has a projection on its surface as shown in FIG. 9, since light rays that strike the projection 2b on the insulator layer 2 are bent toward the center and then get out from the surface of the insulator layer 2 back to the outside, they are not absorbed by the crystalline semiconductor particles 5 around them failing to contribute to generation of carriers.

On the other hand, when the insulator 2 has a recess at its surface as shown in FIG. 8, light rays that strike the insulator layer 2 are bent outward from the center of the recess 2a. Accordingly, they are absorbed by the crystalline semiconductor particles 5 and therefore the ratio of them that contributes to generation of carries increases. In addition, it is apparent that a large part of reflected light rays is also absorbed by the crystalline semiconductor particles 5 after having been caught inside the insulator layer 2 again. Accordingly, when compared with the prior art, the efficiency of utilization of the sunlight that has reached among the crystalline semiconductor particles 5 increases so that significant improvement in conversion efficiency can be anticipated.

It is preferable for the refractive index of the insulator layer 2 to be not less than 1.3 nor more than 2 ($1.3 \leq$ the refractive index $\leq 2$) at wavelengths of 300–800 nm, which are the main constituents of the sunlight spectrum at which the quantum efficiency inside the semiconductor device is high. When the refractive index is less than 1.3, the ratio of light that is bent outward from the center of the recess lowers, deteriorating the efficiency. When the refractive index is more than 2, the critical angle between Si and the insulator layer 2 at long wavelengths increases, which makes it easier for the light that has entered the crystalline semiconductor particles 5 to be directed outside. This may cause the conversion efficiency to drop.

Third Embodiment

Figure 11:
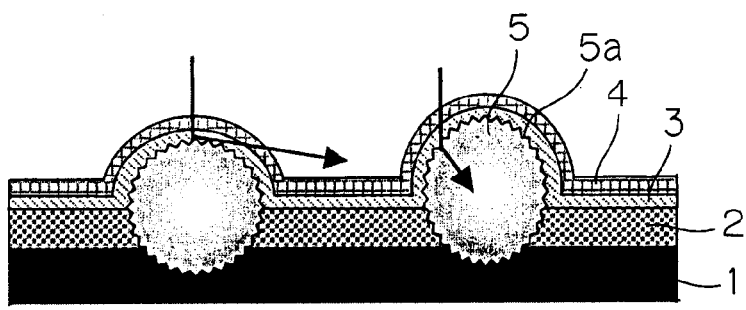
FIG. 11 is a cross sectional view of a third embodiment of the photoelectric conversion device according to this invention in which crystalline semiconductor particles with roughed surfaces are used.

FIG. 11 is a cross sectional view showing a third embodiment of the photoelectric conversion device according to the present invention.

This photoelectric conversion device comprises a substrate 1 serving as lower electrode, a plurality of crystalline semiconductor particles 5 of one conductivity type disposed on the substrate 1, an insulator layer 2 disposed on the substrate 1, and a semiconductor layer 3 of the opposite conductivity type and a protective layer 4 laminated together over the crystalline semiconductor particles 5 and the insulator layer 2.

The substrate 1 serving as lower electrode may be formed as a single part, or a conductive layer may be formed on the surface of a substrate that is made of an insulator such as ceramics or resin so that the conductive layer serves as lower electrode.

The crystalline semiconductor particles 5 are composed of Si or Ge, and small amount of p-type impurities such as B, Al, Ga and the like or small amount of n-type impurities such as P, As, Sb and the like added thereto.

The surfaces 5a of the crystalline semiconductor particles 5 are roughed. By roughing the surfaces of the crystalline semiconductor particles 5, light incident on the crystalline semiconductor particles is allowed to easily enter inside the crystalline semiconductor particles 5, and light reflected at the surfaces 5a of the crystalline semiconductor particles 5 is scattered and directed to adjacent crystalline semiconductor particles 5 so that the conversion efficiency improves. Roughing the surfaces 5a of the crystalline semiconductor particles 5 also provides the effect of enhancing the adhesion between them and the lower electrode.

For roughing the surfaces 5a of the crystalline semiconductor particles 5, there are methods including: etching with chemical solution such as sodium hydrate; chemical dry etching in which crystalline semiconductor particles are exposed to a plasma gas such as $CF_4$; and sandblasting and the like.

The arithmetic average roughness of the surfaces 5a of the crystalline semiconductor particles 5 is preferably not less than 0.01 nor more than 5 (0.01 ≦ the arithmetic average roughness ≦ 5). The "arithmetic average roughness" is defined to be an average of $|f(x)|$ which are sampled in some length or region of the surface of the semiconductor particle 5, where $f(x)$ is a deviation ($\mu$m) of the height pattern from the average thereof (JIS B 0601). When the arithmetic average roughness is less than 0.01, the effects of light absorption and light scattering are so small that neither the conversion efficiency nor the adhesion improves, which is unfavorable. When the arithmetic average roughness is over 5, PN-junctions may not be evenly formed or the quality of PN-junctions may deteriorate causing the conversion efficiency to drop, which is also unfavorable.

The effect of improving the conversion efficiency is particularly significant when the arithmetic average roughness of the surfaces 5a of the crystalline semiconductor particles 5 is not less than 0.05 nor more than 1 (0.05 ≦ the arithmetic average roughness ≦ 1). Arithmetic average roughness in the above range is therefore more desirable.

The shapes of the p-type crystalline semiconductor particle 5 may be polygons or shapes having curved surfaces. The particle sizes may be even or uneven. However, uneven particle sizes will be advantageous in terms of cost because an additional process is required in order to uniformize the size of the semiconductor particles. Furthermore, having convex surfaces reduces the dependence of the conversion efficiency on the incident angles of light rays.

The process for arranging the crystalline semiconductor particles 5, the compositions of the insulator layer 2 and the protective layer 4 and the formation processes thereof have been explained in the description of the first embodiment, and therefore will not be repeated here.

The semiconductor layer 3 is formed by methods such as Vapor-phase growth, thermal diffusion, ion implantation, Plasma Doping or the like. In a Vapor-phase growth method, a vapor-phase phosphorous system compound that is an n-type impurity is added in small amount to a vapor-phase silane compound. The semiconductor layer 3 maybe monocrystal, polycrystalline, microcrystalline or amorphous. The concentration of the microelements in the semiconductor layer 3 may be, for instance, in the range of $1 \times 10^{16} - 1 \times 10^{22}$ atm/cm$^3$. Meanwhile, the semiconductor layer 3 may also serve as upper electrode. It is also possible to form an upper electrode containing tin oxide, zinc oxide or the like between the semiconductor layer 3 and the protective layer 4.

FIG. 11 illustrates an example including a semiconductor layer 3 formed by Vapor-phase Growth or the like and a protective layer 4 formed on the semiconductor layer 3.

Figure 12:
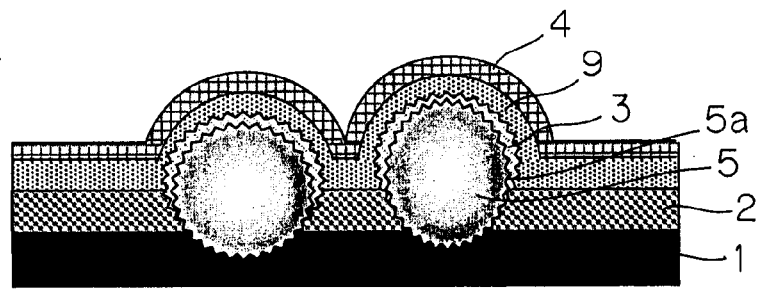
FIG. 12 is a cross sectional view showing another arrangement of this invention.

FIG. 12 illustrates an example including a semiconductor layer 3 formed over crystalline semiconductor particles 5 by ion implantation or the like, a transparent conductive layer 9 which is an upper electrode formed on the semiconductor layer 3, and a protective layer 4 further formed on top of these.

Examples of the photoelectric conversion device according to the present invention are now described.

EXAMPLE 3.1

An insulator layer 2 was formed on a substrate 1. Aluminum was used for the substrate 1 so that the substrate serves also as lower electrode. Glass paste was used for forming the insulator layer 2 on the substrate 1 to a thickness of 100 $\mu$m. The glass used for the glass paste was a phosphorous oxide-based glass having a softening temperature of 480° C.

On the insulator layer 2, p-type granular silicon particles 5 with roughed surfaces whose average diameter was 400 $\mu$m were deposited, and they were pressed into the insulator layer until they came in contact with the substrate 1. The p-type granular silicon particles 5 had been dipped into sodium hydrate solution so that their surfaces were roughed.

Subsequently, heat treatment is carried out so as to fire the insulator layer 2 comprising glass paste. An n-type silicon layer 3 with a thickness of 400 nm was formed over the silicon particles 5 and the insulator layer 2. The n-type silicon layer 3 was intended to serve as upper electrode layer. A silicon nitride layer of 80 nm in thickness was further formed on top of these as a protective film 4.

Figure 13:
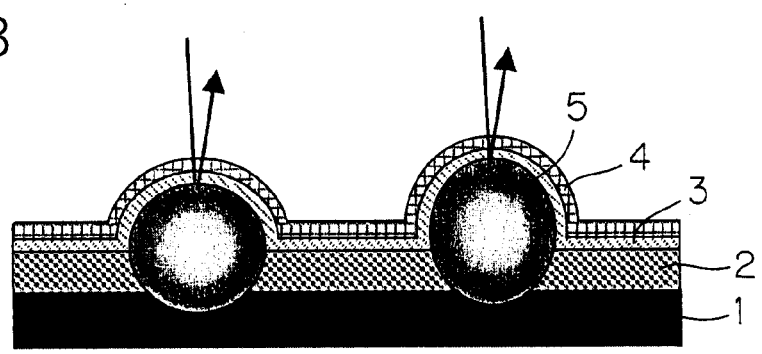
FIG. 13 is a cross sectional view showing a comparative example.

The arithmetic average roughness of the surfaces of the p-type granular silicon particles 5 was varied, and the conversion efficiency and adhesion were evaluated in each case, the result of which is shown in Table 3.1. Evaluation was carried out also on comparative examples with silicon particles 5 whose surfaces were not roughed as shown in FIG. 13.

The evaluation of the arithmetic average roughness was carried out according to JIS.

Evaluation of the adhesion was performed after exposing samples to a 85° C., 95% RH environment for 1000 hours, by observing the presence/absence of cracking between the substrate 1 and the p-type silicon particles 5. Samples that had no cracking observed were marked by ◯, samples that had cracking in a limited area were marked by Δ, and samples that suffered cracking in half or more of the whole areas were marked by X.

TABLE 3.1

| | Arithmetic average roughness | Adhesion | Conversion efficiency (%) |
|---|---|---|---|
| Example 3-1 | 0.01 | ○ | 8.8 |
| Example 3-2 | 0.05 | ○ | 9.7 |
| Example 3-3 | 0.1 | ○ | 10.4 |
| Example 3-4 | 1 | ○ | 10.3 |
| Example 3-5 | 5 | ○ | 8.6 |
| Comparative example 3-1 | 0.003 | X | 7.0 |
| Comparative example 3-2 | 0.006 | Δ | 7.4 |
| Comparative example 3-3 | 20 | ○ | 7.2 |

As is apparent from the result above, photoelectric conversion devices having silicon particles whose surfaces have been roughed exhibit higher conversion efficiencies and adhesions than those of photoelectric conversion devices having silicon particles whose surfaces are not roughed. Examples 3-1 to 3-5 whose arithmetic average roughness is not less than 0.01 nor more than 5 (0.01 ≦ arithmetic average roughness ≦5) are preferred. More desirably, the arithmetic average roughness is not less than 0.05 nor more than 1 (0.05 ≦ arithmetic average roughness ≦1).

Comparative examples 3-1 and 3-2 whose arithmetic average roughness is less than 0.01 are unfavorable because of the small conversion efficiencies and poor adhesions. Comparative example 3-3 whose arithmetic average roughness is over 5 is also unfavorable because of the dropped conversion efficiency.

EXAMPLE 3.2

A substrate 1 was formed by using an aluminum-chromium alloy, on which an insulator layer 2 was formed. Glass paste was used to form the insulator layer 2 on the substrate 1 to a thickness of 200 μm. The glass used for the glass paste was a boron oxide-based glass having a softening temperature of 560° C. P-type granular silicon particles 5 with an average diameter of 700 μm whose surfaces had been roughed were deposited on the insulator layer 2. The surfaces of the silicon particles 5 had been roughed by sandblasting.

Subsequently, heat treatment was carried out so as to fire the glass paste. Then, phosphine and hydrogen were introduced into the chamber to which RF power was applied so as to turn them into a plasma and disperse phosphorous on the surfaces of the p-type granular silicon particles, thereby forming a 30 nm thick n-type silicon layer 3. A tin oxide upper electrode was formed 150 nm on the n-type silicon layer 3, on which a silicon nitride layer with a thickness of 200 nm was further formed as a protective film 4.

The arithmetic average roughness of the surfaces of the p-type granular silicon particles was varied, and the conversion efficiency and adhesion were evaluated in each case, the result of which is shown in Table 3.2.

TABLE 3.2

| | Arithmetic average roughness | Adhesiveness | Conversion efficiency (%) |
|---|---|---|---|
| Example 3-6 | 0.01 | ○ | 8.3 |
| Example 3-7 | 0.05 | ○ | 9.7 |
| Example 3-8 | 0.1 | ○ | 10.5 |
| Example 3-9 | 1 | ○ | 10.0 |
| Example 3-10 | 5 | ○ | 8.2 |
| Comparative example 3-4 | 0.003 | X | 6.1 |
| Comparative example 3-5 | 0.006 | Δ | 6.4 |
| Comparative example 3-6 | 20 | ○ | 5.6 |

As is obvious from the result above, photoelectric conversion devices having silicon particles whose surfaces have been roughed exhibit higher conversion efficiencies and adhesions than those of photoelectric conversion devices having silicon particles whose surfaces are not roughed. In particular, examples 3-6 to 3-10 whose arithmetic average roughness is not less than 0.01 nor more than 5 (0.01 ≦ arithmetic average roughness ≦5) are preferred. Examples 3-6 to 3-9 whose arithmetic average roughness is not less than 0.05 nor more than 1 (0.05 ≦ arithmetic average roughness ≦1) are more desirable.

Comparative examples 3-4 and 3-5 whose arithmetic average roughness is less than 0.01 are unfavorable because they have little effect in improving the conversion efficiency and poor adhesions. Comparative example 3-6 whose arithmetic average roughness is over 5 is also unfavorable because of the dropped conversion efficiency.

Fourth Embodiment

Figure 14:
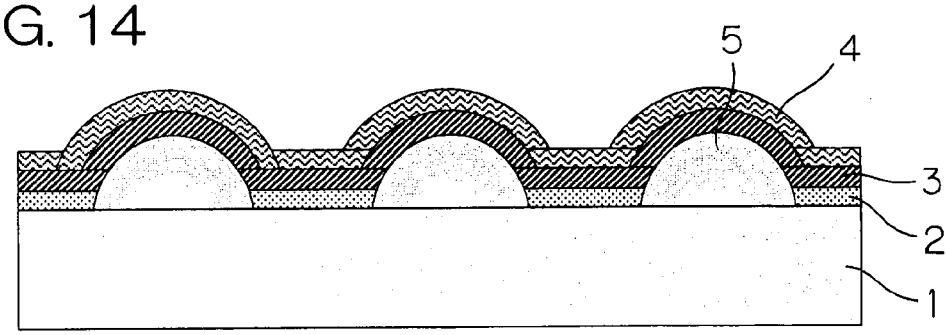
FIG. 14 is a cross sectional view of a fourth embodiment of the photoelectric conversion device according to this invention.

FIG. 14 is a cross sectional view showing a fourth embodiment of the photoelectric conversion device according to this invention.

This photoelectric conversion device is arranged such that a plurality of crystalline semiconductor particles 5 of one conductivity type are disposed on a substrate 1 serving as lower electrode on which an insulator layer 2 is formed, and a semiconductor layer 3 of the opposite conductivity type and a protective layer 4 are laminated together thereon.

The substrate 1 comprises a metal or an alloy of metal and semiconductor material. Materials used for the substrate 1 are the same as those illustrated in the description of the first embodiment. To mention them again, Al and alloys thereof are suitable. More specifically, the suitable materials will be Al with a purity of 99% or more (JIS 1 N99, 1 085, etc.), and Al alloys such as Al—Si, Al—Mg, Al—Ti and the like with small amount of additives.

It is also possible to use another metal or an insulator such as ceramics and resin for the substrate 1, and to form a lower electrode on the surface of the substrate.

Figure 15:
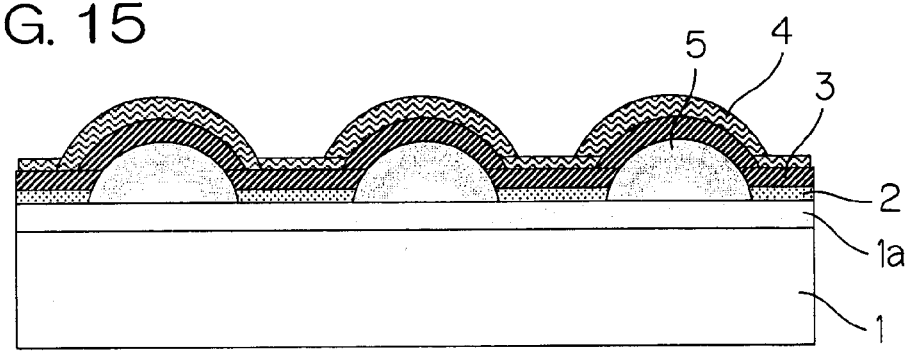
FIG. 15 is a cross sectional view showing another substrate structure of the photoelectric conversion device in FIG. 14.

FIG. 15 illustrates an example in which a surface region 1a that serves as lower electrode is formed on a substrate 1, on which crystalline semiconductor particles 5 are disposed.

The crystalline semiconductor particles 5 are a p-type semiconductor comprising Si or Ge, and small amount of B, Al, Ga and the like added thereto, or an n-type semiconductor comprising Si or Ge, and small amount of P, As and the like added thereto.

The crystalline semiconductor particles 5 form ohmic contact with the substrate 1 or its surface region 1a. The ohmic contact is formed by mutual diffusion or melt reaction. In particular, the device is suitable for practical use when it is arranged such that the material of the crystalline semiconductor particles 5 and the metal material constituting the substrate 1 react to each other by melting on heating thereby forming an alloy layer.

A joining process is now described referring to a case where silicon was used as the semiconductor material. P-type silicon with small amount of B added thereto is used.

In this case, an Al—Si alloy layer is preferably formed since the Al—Si layer that functions as a P+ layer contribute to improvement in conversion efficiency. For this reason, Al or an Al—Si alloy is preferably used for the substrate 1.

Figure 16:
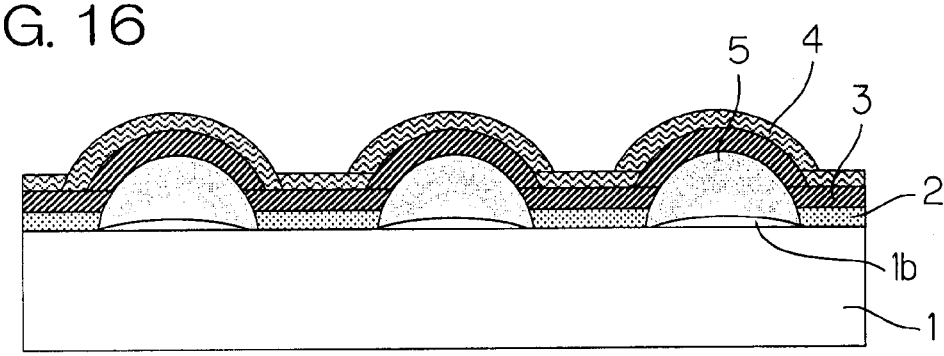
FIG. 16 is a cross sectional view showing still another substrate structure of the photoelectric conversion device in FIG. 14.

FIG. 16 shows an example in which portions 1b forming ohmic contact constitute a part of crystalline semiconductor particles 5.

A semi-finished product (hereinafter referred to as the "element") in which the crystalline semiconductor particles 5 and the substrate 1 have been joined together is to be provided with a drain electrode for charge separation at PN-junctions.

An insulator layer 2 for ensuring the charge separation is formed. This insulator layer 2 prevents current leakage due to short-circuit at the PN-junctions (junctions between 5 and 3) which are the photovoltaic power generation element in the crystalline semiconductor particles 5.

In the fourth embodiment of this invention, the insulator layer 2 is formed by putting the element after the joining into an electrolytic solution with the element connected to the positive electrode so as to be treated by anodic oxidation. The electrolytic solution may be a diluted solution comprising sulfuric acid, ammonium borate, phosphoric acid or oxalic acid, or a mixture of them. Conditions for the oxidation are determined based on parameters such as the kind, concentration, and temperature of the electrolytic solution, and the voltage and current.

The parameters for the above anodic oxidation are considered as follows:

Select an electrolytic solution and conditions for forming the insulator layer 2 taking the light absorption and light reflection characteristics of the insulator layer 2 into account. When utilization of light reflection and refraction is considered in the designing, it is preferable to form a transparent insulator that is most unlikely to absorb light in order to improve the conversion efficiency. More specifically, using ammonium borate or the like for the electrolytic solution can restrain the formed insulator layer 2 from absorbing light. However, also in such a case, the degree of coloration varies depending on the concentration of the electrolytic solution, the voltage and current during the anodic oxidation, and the temperature of the electrolytic solution.

At the same time, the angle between the crystalline semiconductor particles 5 and the substrate 1 is also important in anodic oxidation.

Figure 17:
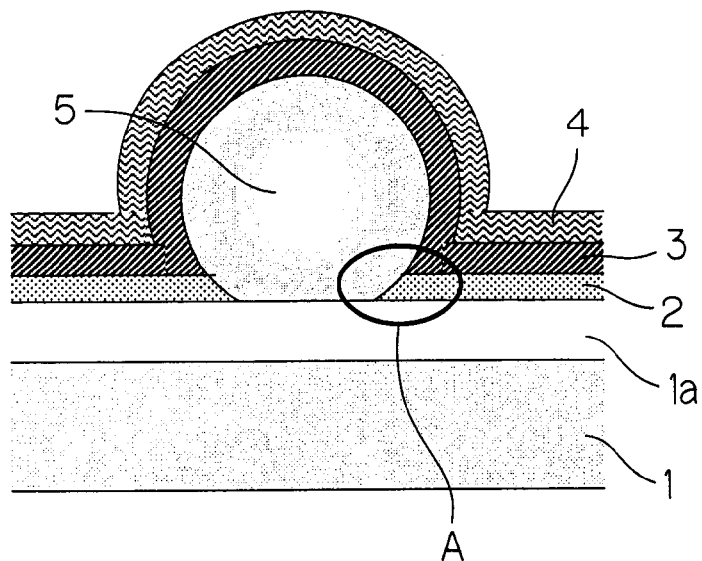
FIG. 17 is a cross sectional view for illustrating a condition of an insulator layer having been formed.

FIG. 17 is a cross sectional view showing a junction between a crystalline semiconductor particle 5 and a substrate 1. Since the insulator layer 2 to be formed by anodic oxidation is selectively formed only on the upper part of the aluminum or an aluminum alloy that forms an anode, the area at which the insulator layer 2 is formed needs to be supplied with sufficient amount of electrolytic solution. The condition of the formed insulator layer 2 varies depending on the angle θ between the crystalline semiconductor particle 5 and the substrate 1. In order to supply ample electrolytic solution and keep the electrolytic solution fresh without stagnation, the angle θ is preferably an obtuse angle.

Figure 18:
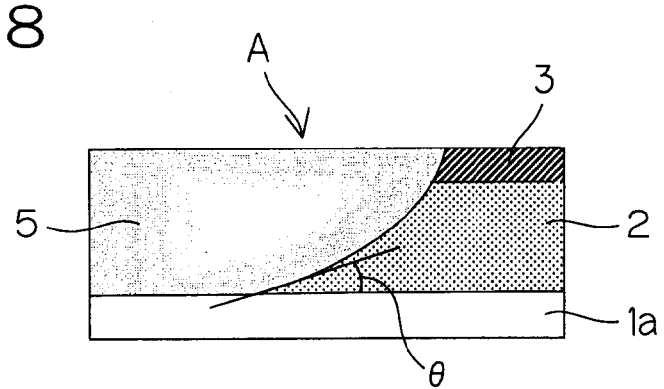
FIG. 18 is an enlarged view of the junction A between the crystalline semiconductor particle and the substrate where θ<90 deg.
Figure 19:
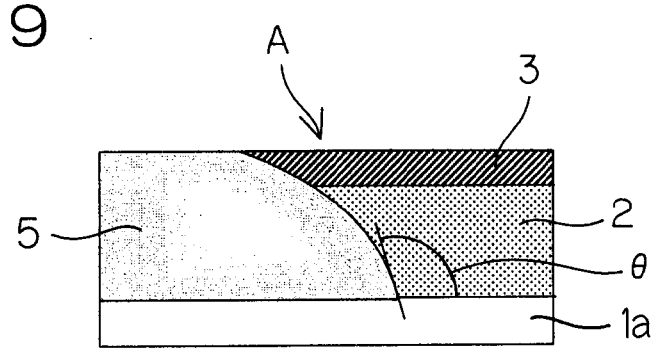
FIG. 19 is an enlarged view of the junction A between the crystalline semiconductor particle and the substrate where θ>90 deg.
Figure 20:
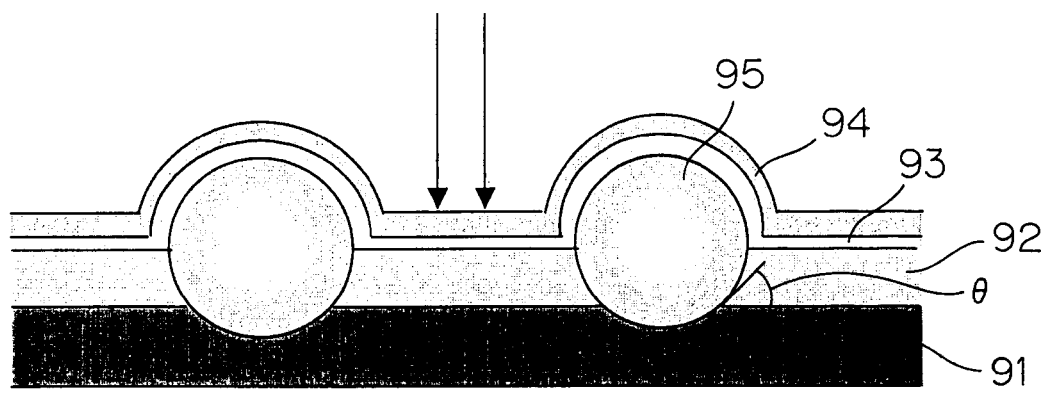
FIG. 20 is a cross sectional view showing the structure of a conventional photoelectric conversion device.

FIGS. 18 and 19 are enlarged views showing the junction A between the crystalline semiconductor particle 5 and the substrate 1.

When the angle θ at the junction between the crystalline semiconductor particle 5 and the substrate 1 is acuter than 90 degrees as shown in FIG. 18, the insulator layer 2 is not supplied with sufficient electrolytic solution at the edge part of the joining area A so that the electric field is not applied to the edge part. Also, growth of the insulator layer 2 in the normal direction is restrained. (Generally, the direction of the growth of anodic oxide films is vertical to the substrate). Therefore, clearances are generated between the crystalline semiconductor particle 5 and the substrate 1. When a semiconductor layer 3 of the opposite conductivity type is formed on such an insulator layer, due to the lack of the insulator in a part between the insulator layer 2 and the crystalline semiconductor particle 5, short-circuit will occur causing current leakage. As a result, the conversion efficiency will drop.

On the other hand, when the angle at the junction is over 90 degrees as in FIG. 19, the junction is supplied with sufficient amount of electrolytic solution so that the insulator film can grow in the normal direction without restriction. The drawbacks mentioned above can therefore be avoided, which is preferable.

After forming the insulator layer 2 on the substrate 1 in the above stated manner, the semiconductor layer 3 of the opposite conductivity type is formed allover the element. Since the process for forming this semiconductor layer 3 of the opposite conductivity type is the same as that in the description of the first embodiment, the explanation thereof is omitted here. Subsequently, a protective film 5 is formed on the semiconductor layer 3 of the opposite conductivity type. The process for forming this protective film 5 is also the same as that in the description of the first embodiment. The explanation thereof is therefore omitted.

EXAMPLE 4.1

A substrate made of aluminum was used. Silicon crystalline particles were attached to the surface of the substrate by means of melting. A 100 μm thick Al (3003 with a purity of 99.95%)was used for the substrate. Hemispherical semiconductor silicon particles obtained from spherical silicon particles of 400 μm in diameter were attached to the substrate by melting in which the radius of cross section area at the junction was 190 μm. The angle θ at the junction was 103 degrees.

Meanwhile, the hemispherical semiconductor silicon particles were fabricated by polishing one side of spherical silicon particle.

The element after the joining process was connected to the anode and subjected to anodic oxidation in a sulfuric acid electrolytic solution. A diluted (20%) sulfuric acid solution was used for the electrolytic solution. The anodic oxidation was carried out by controlling the electrolytic bath to keep a temperature of 25° C. with a current density of 30 mA/cm$^2$ and a voltage of 20 V. The element was taken out after 30 minutes of oxidation, and the thickness of the deposited oxide film was measured by observing a cross section. A dense oxide film was formed at the junction area between the silicon particles and the substrate. The thickness of an average oxide film was 30 μm.

COMPARATIVE EXAMPLE 4.1a

Semispherical semiconductor particles obtained from spherical silicon particles were joined to the substrate in the same way as in example 4.1. Then, oxidation was carried out in an oxidative atmosphere at 850° C. for 30 minutes so as to form an insulator film on the substrate made of aluminum. As a result, the aluminum completely melted and shapes of the silicon particles were not recognizable at all.

COMPARATIVE EXAMPLE 4.1b

Joining of silicon particles to the substrate was carried out in the same way as in example 4.1, and an insulator film was formed by an evaporation method.

With the granular portions on the element masked, an aluminum oxide insulator film was formed by sputtering to a thickness of 30 μm. The insulator film was observed after the element was taken out. Numerous microcracks starting from the junctions between the crystalline semiconductor particles and the substrate were generated throughout the substrate, failing to form a dense insulator layer at the junction area.

EXAMPLE 4.2

Crystalline silicon particles were processed to have semi-spherical shapes, in which their radius of cross section area was varied as 200 μm, 190 μm, 180 μm, and 140 μm. Each element was formed by joining the silicon particles to the substrate so as to have the same cross section as in example 4.1. The angles θ at the junctions between the silicon particles and the substrate were 90 deg., 103 deg., 116 deg., and 135 deg., respectively. Each element was subjected to anodic oxidation so as to form an oxide film as an insulator layer in the same manner as example 4.1. The element was cleaned with pure water after the formation of the insulator layer, and the electrolytic solution and water were removed by hot air drying at 80° C. The surface was then cleaned in a vacuum chamber, and an n-type crystalline silicon film of the second conductivity type was formed to the thickness of 400 nm. Subsequently, an ITO transparent electrode serving also as a protective layer was formed by sputtering. Finally, screen printing was performed in which Ag paste was patterned and applied on top of the layer and then baked so as to form a collector electrode, thereby completing a photoelectric conversion device.

The forward current and reverse current values obtained in a dark condition under application of 0.5 V, and the conversion efficiency were measured for each set of particle size and angle θ at the junction, the result of which is shown in Table 4.

TABLE 4

| | Radius of joined area (μm) | Angle θ at junction (deg.) | Forward current (mA/cm2) | Reverse current (mA/cm2) | Conversion efficiency (%) |
|---|---|---|---|---|---|
| Example 4-1 | 140 | 135 | 19 | 0.02 | 7.5 |
| Example 4-2 | 180 | 116 | 19 | 0.02 | 7.6 |
| Example 4-3 | 190 | 103 | 19 | 0.02 | 7.6 |
| Example 4-4 | 200 | 90 | 20 | 0.02 | 7.7 |
| Comparative example 4-1 | 190 | 77 | 11 | 0.1 | 5.3 |
| Comparative example 4-2 | 180 | 64 | 8 | 1.5 | 2.1 |
| Comparative example 4-3 | 140 | 45 | 5 | 2.8 | 1.1 |

COMPARATIVE EXAMPLE 4.2

In the same way as example 4.2, photoelectric conversion devices were fabricated with the same radiuses of the joined areas of the silicon particles as those in example 4.2, and angles θ at the junctions between the silicon particles and the substrate which were different from those in example 4.2. The radiuses of the junction areas were 190 μm, 180 μm, and 140 μm where the angles θ at the junctions were 77 deg., 64 deg., and 45 deg., respectively. The dark current values and the conversion efficiency were measured in each case in the same way as example 4.2, the result of which is shown in Table 4.

Observation of a cross section of the junction area in the sample of comparative example 4-1 revealed that the formation of the insulator layer 2 between the crystalline semiconductor particles 5 and the substrate 1 shown in FIG. 17 was imperfect so that the distance between the substrate and the n-type crystalline silicon film 3 of the second conductivity type formed afterwards was too short to provide sufficient insulation therebetween.

The above result indicates that when joining was carried out at angles smaller than 90 deg., the acuter the angle θ was, the less sufficiently the forward current value and reverse current value separated from each other. In contrast, when the angle θ was 90 deg. or more, the separation was sufficient so that the leakage current was reduced, whereby improving the conversion efficiency.

What is claimed is:

1. A photoelectric conversion device comprising:
   a lower electrode;
   numerous crystalline semiconductor particles of one conductivity type deposited on the lower electrode;
   an insulator interposed among the crystalline semiconductor particles; and
   a semiconductor layer of the opposite conductivity type provided over the crystalline semiconductor particles, wherein the light-receiving surface of the insulator includes a recess formed at a position between the crystalline semiconductor particles, wherein the minimum thickness of the insulator at the recess is not more than 95% of the thickness of the insulator at an area around the recess.

2. The photoelectric conversion device according to claim 1, wherein the refractive index of the insulator is not less than 1.3 nor more than 2 at wavelengths of 400–800 nm.

3. A photoelectric conversion device comprising:
   a lower electrode;
   numerous crystalline semiconductor particles of one conductivity type deposited on the lower electrode;
   an insulator interposed among the crystalline semiconductor particles; and
   a semiconductor layer of the opposite conductivity type provided over the crystalline semiconductor particles, wherein the crystalline semiconductor particles comprise a rough surface, wherein the arithmetic average roughness of the surface of the crystalline semiconductor particles is not less than 0.01 nor more than 5.

4. A photoelectric conversion device comprising:
   a lower electrode;
   numerous hemispherical crystalline semiconductor particles of one conductivity type deposited on the lower electrode;
   an insulator interposed among the hemispherical crystalline semiconductor particles; and
   a semiconductor layer of the opposite conductivity type provided over the hemispherical crystalline semiconductor particles, wherein the surfaces of the hemispherical crystalline semiconductor particles and the lower electrode make an angle of 90 degrees or more.

5. The photoelectric conversion device according to claim 4, wherein a surface region of the lower electrode comprises aluminum or an aluminum alloy.

6. A method of manufacturing a photoelectric conversion device comprising the steps of:
   joining numerous hemispherical crystalline semiconductor particles of one conductivity type to a substrate having a conductive region at the surface;
   forming an insulating region among the hemispherical crystalline semiconductor particles by subjecting the conductive region at the surface of the substrate to anodic oxidation; and
   forming a semiconductor layer of the opposite conductivity type over the hemispherical crystalline semiconductor particles and the insulating region.

7. The method of manufacturing a photoelectric conversion device according to claim 6, wherein the surfaces of the hemispherical crystalline semiconductor particles and the substrate make an angle of 90 degrees or more.

8. The method of manufacturing a photoelectric conversion device according to claim 6, wherein the conductive region at the surface of the substrate comprises aluminum or an aluminum alloy.

* * * * *